United States Patent
Hu

(10) Patent No.: US 12,038,646 B2
(45) Date of Patent: Jul. 16, 2024

(54) THIN FILM TRANSISTOR DEVICE, BACKLIGHT MODULE, AND DISPLAY PANEL

(71) Applicants: Huizhou China Star Optoelectronics Display Co., Ltd., Huizhou (CN); TCL China Star Optoelectronics Technology Co., Ltd., Shenzhen (CN)

(72) Inventor: Daobing Hu, Huizhou (CN)

(73) Assignees: Huizhou China Star Optoelectronics Display Co., Ltd., Huizhou (CN); TCL China Star Optoelectronics Technology Co., Ltd., Shenzhen (CN)

(*) Notice: Subject to any disclaimer, the term of this patent is extended or adjusted under 35 U.S.C. 154(b) by 228 days.

(21) Appl. No.: 17/607,498

(22) PCT Filed: May 31, 2021

(86) PCT No.: PCT/CN2021/097525
§ 371 (c)(1),
(2) Date: Oct. 29, 2021

(87) PCT Pub. No.: WO2022/233075
PCT Pub. Date: Nov. 10, 2022

(65) Prior Publication Data
US 2023/0266624 A1    Aug. 24, 2023

(30) Foreign Application Priority Data

May 7, 2021  (CN) .......................... 202110494223.8

(51) Int. Cl.
*G02F 1/1334* (2006.01)
*G02F 1/1335* (2006.01)
(Continued)

(52) U.S. Cl.
CPC .. *G02F 1/133612* (2021.01); *G02F 1/133603* (2013.01); *H01L 27/1222* (2013.01); *H01L 29/78633* (2013.01); *H01L 29/78696* (2013.01)

(58) Field of Classification Search
CPC ..................................................... G02F 1/1334
See application file for complete search history.

(56) References Cited

U.S. PATENT DOCUMENTS

| 2003/0025127 A1* | 2/2003 | Yanai ................ H01L 29/78621 |
| | | 257/E29.279 |
| 2015/0060772 A1* | 3/2015 | Miyata ................ H01L 29/7391 |
| | | 438/283 |

(Continued)

FOREIGN PATENT DOCUMENTS

| CN | 106505072 | 3/2017 |
| CN | 108598155 | 9/2018 |

(Continued)

*Primary Examiner* — Sang V Nguyen

(57) ABSTRACT

The present disclosure provides a thin film transistor device, a backlight module, and a display panel. The thin film transistor device includes a source portion, an active layer located on the source portion, a drain portion spaced apart from the source portion, and a conductor portion located on the active layer and extending to the drain portion. According to the present disclosure, the active layer is disposed on the source portion, and the drain portion is electrically connected to the active layer using the conductor portion, so that a current is transmitted from the drain portion to the active layer through the conductor portion.

15 Claims, 3 Drawing Sheets

(51) Int. Cl.
*G02F 1/13357* (2006.01)
*H01L 27/12* (2006.01)
*H01L 29/786* (2006.01)

(56) References Cited

U.S. PATENT DOCUMENTS

| | | | |
|---|---|---|---|
| 2015/0131020 A1 | 5/2015 | Chang | |
| 2016/0027890 A1 | 1/2016 | Hahn | |
| 2016/0204267 A1 | 7/2016 | Moon et al. | |
| 2019/0196638 A1* | 6/2019 | Tominaga | G06F 3/044 |
| 2021/0200003 A1* | 7/2021 | Li | H01L 27/1222 |
| 2022/0223676 A1* | 7/2022 | Kokame | H05B 33/22 |
| 2022/0320449 A1* | 10/2022 | Wang | H10K 59/1201 |

FOREIGN PATENT DOCUMENTS

| | | | | |
|---|---|---|---|---|
| CN | 108919572 | * | 11/2018 | G02F 1/1334 |
| CN | 110416316 | | 11/2019 | |
| CN | 111370496 | | 7/2020 | |
| JP | 06-268220 | | 9/1994 | |

\* cited by examiner

THIN FILM TRANSISTOR DEVICE, BACKLIGHT MODULE, AND DISPLAY PANEL

RELATED APPLICATIONS

This application is a National Phase of PCT Patent Application No. PCT/CN2021/097525 having International filing date of May 31, 2021, which claims the benefit of priority of Chinese Patent Application No. 202110494223.8 filed on May 7, 2021. The contents of the above applications are all incorporated by reference as if fully set forth herein in their entirety.

FIELD AND BACKGROUND OF THE INVENTION

The present disclosure relates to the field of display technologies, and in particular, to a thin film transistor device, a backlight module, and a display panel.

Compared with backlight of a conventional light-emitting diode (LED), backlight of a mini light-emitting diode (mini LED) backlight can achieve a million-class contrast to improve display quality.

Currently, a back panel of the mini LED is driven using a current. Since a thin film transistor device used to drive the mini LED has limited mobility, stability, or process accuracy, a final current outputted by the thin film transistor devices is low. As a result, the mini LED cannot obtain a driving current that is large enough, reducing a backlight intensity of the back panel of the mini LED.

Therefore, a thin film transistor device, a backlight module, and a display panel that can increase a driving current of the thin film transistor device are required.

SUMMARY OF THE INVENTION

Technical Problem

The present disclosure aims to provide a thin film transistor device, a backlight module, and a display panel, which resolve a problem of a low backlight intensity of a back panel of a mini LED as a result of a low driving current of the mini LED in the prior art.

Technical Solution

Embodiments of the present disclosure provide a thin film transistor device. The thin film transistor device includes:
a gate portion;
a source portion;
an active layer, located on the source portion;
a drain portion, spaced apart from the source portion and the active layer; and
a conductor portion, located on the active layer and extending to the drain portion.

In an embodiment, the drain portion and the source portion are disposed in a same layer.

In an embodiment, the gate portion is located above or below the active layer, and the gate portion includes an effective gate area disposed opposite to the active layer.

An area of the conductor portion that is disposed opposite to the effective gate area or an area of the source portion that is disposed opposite to the effective gate area includes a hollowed-out area.

In an embodiment, the hollowed-out area has disposed thereon at least one of a metal grid and a plurality of metal wires intersecting each other.

In an embodiment, the gate portion is located on a surface of the conductor portion that is away from the active layer, and a material forming the conductor portion includes metal nanowires.

In an embodiment, the thin film transistor device includes:
a blocking portion, covering a side of the source portion that is close to the drain portion.

In an embodiment, a side of the source portion that is close to the drain portion protrudes from the active layer, and the blocking portion further covers a part, on the side of the source portion that is close to the drain portion, that protrudes from the active layer.

In an embodiment, the conductor portion covers the active layer and extends to the blocking portion.

The embodiments of the present disclosure further provide a backlight module. The backlight module includes a back panel, a plurality of thin film transistor devices, and a plurality of light-emitting devices. The plurality of thin film transistor devices and the plurality of light-emitting devices are located on the back panel, and each thin film transistor device is electrically connected to the corresponding light-emitting device.

The thin film transistor device includes a gate portion, a source portion, an active layer, a drain portion, and a conductor portion. The active layer is located on the source portion, the drain portion is spaced apart from the source portion and the active layer, and the conductor portion is located on the active layer and extends to the drain portion.

In an embodiment, the drain portion and the source portion are disposed in a same layer.

In an embodiment, the gate portion is located above or below the active layer, and the gate portion includes an effective gate area disposed opposite to the active layer.

An area of the conductor portion that is disposed opposite to the effective gate area or an area of the source portion that is disposed opposite to the effective gate area includes a hollowed-out area.

In an embodiment, the hollowed-out area has disposed thereon at least one of a metal grid and a plurality of metal wires intersecting each other.

In an embodiment, the gate portion is located on a surface of the conductor portion that is away from the active layer, and a material forming the conductor portion includes metal nanowires.

In an embodiment, the thin film transistor device includes:
a blocking portion, covering a side of the source portion that is close to the drain portion.

In an embodiment, a side of the source portion that is close to the drain portion protrudes from the active layer, and the blocking portion further covers a part, on the side of the source portion that is close to the drain portion, that protrudes from the active layer.

In an embodiment, the conductor portion covers the active layer and extends to the blocking portion.

The embodiments of the present disclosure further provide a display panel. The display panel includes a liquid crystal cell and a backlight module. The liquid crystal cell is disposed on a light exit face of the backlight module. The backlight module includes a back panel, a plurality of thin film transistor devices, and a plurality of light-emitting devices. The plurality of thin film transistor devices and the plurality of light-emitting devices are located on the back panel, and each thin film transistor device is electrically connected to the corresponding light-emitting device.

The thin film transistor device includes a gate portion, a source portion, an active layer, a drain portion, and a conductor portion. The active layer is located on the source portion, the drain portion is spaced apart from the source portion and the active layer, and the conductor portion is located on the active layer and extends to the drain portion.

In an embodiment, the drain portion and the source portion are disposed in a same layer.

The embodiments of the present disclosure further provide a display panel. The display panel includes:

a base plate;

a thin film transistor layer, located on the base plate and including a plurality of thin film transistor devices; and a light-emitting layer, located on the thin film transistor layer and including a plurality of light-emitting portions and a plurality of pixel define portions, wherein each light-emitting portion is electrically connected to the corresponding thin film transistor device, and each pixel define portion is located between two adjacent light-emitting portions.

The thin film transistor device includes a gate portion, a source portion, an active layer, a drain portion, and a conductor portion. The active layer is located on the source portion, the drain portion is spaced apart from the source portion and the active layer, and the conductor portion is located on the active layer and extends to the drain portion.

Beneficial Effects

The present disclosure provides a thin film transistor device, a backlight module, and a display panel. The thin film transistor device includes a source portion, an active layer, a drain portion, and a conductor portion. The active layer is located on the source portion, the drain portion is spaced apart from the source portion, the conductor portion is located on the active layer and extends to the drain portion, and the drain portion is electrically connected to the active layer using the conductor portion. According to the present disclosure, the active layer is disposed on the source portion, and the drain portion is electrically connected to the active layer using the conductor portion, so that a current can be transmitted from the drain portion to the active layer through the conductor portion Further, the current can be transmitted to the source portion in a thickness direction of the active layer. A transmission path for the current is shortened, a driving current of the thin film transistor device is increased, and a backlight intensity of the backlight module and an illumination intensity of the display panel are improved.

BRIEF DESCRIPTION OF THE SEVERAL VIEWS OF THE DRAWINGS

The following describes specific implementations of the present disclosure in detail with reference to the accompanying drawings, to make the technical solutions and other beneficial effects of the present disclosure obvious.

DESCRIPTION OF PREFERRED EMBODIMENTS OF THE INVENTION

Figure 1:
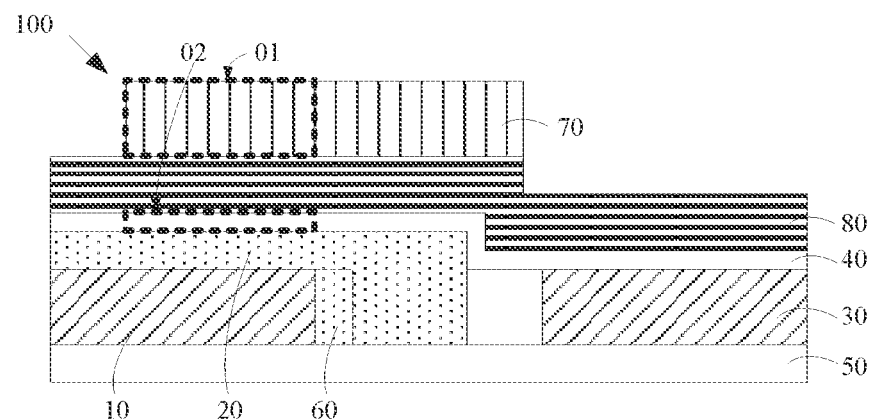
FIG. 1 is a schematic cross-sectional view of a thin film transistor device according to an embodiment of the present disclosure.

Technical solutions in embodiments of the present disclosure are clearly and completely described below with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure. In the description of the present disclosure, it should be understood that, orientational or positional relationships indicated by the terms such as "upper", "lower", and "near" are orientational or positional relationships shown in the accompanying drawings. For example, the term "upper" merely refers to a position located above an object, and specifically refers to being located directly above or obliquely above, or on an upper surface, as long as the position is located above a horizontal plane of the object; and the term "two sides" refers to two opposite positions of the object that can be shown in the figure, and the two positions can be in direct or indirect contact with the object. The foregoing orientational or positional relationships are merely used for ease and brevity of illustration and description, rather than indicating or implying that the indicated apparatus or element must have a particular orientation or must be constructed and operated in a particular orientation. Therefore, such terms should not be construed as a limitation to the present disclosure. In addition, it should be noted that the accompanying drawings provide merely structures and steps that are closely related to the present disclosure, and omit some details that are not quite relevant to the present disclosure, to simplify the accompanying drawings and make the features of the present disclosure more prominent, rather than indicating that a device and a method in practice are exactly the same as those in the accompanying drawings. Therefore, the accompanying drawings are not intended to limit the device and the method in practice.

The present disclosure provides a thin film transistor device. The thin film transistor device includes, but is not limited to, the following embodiments and combination of the following embodiments.

In an embodiment, as shown in FIGS. 1 to 4, a thin film transistor device 100 includes: a gate portion 70; a source portion 10; an active layer 20, located on the source portion 10; a drain portion 30, spaced apart from the source portion 10 and the active layer 20; and a conductor portion 40, located on the active layer 20 and extending to the drain portion 30.

It should be noted that, in the thin film transistor device 100, the drain portion 30 is spaced apart from the source portion 10. The active layer 20 and the conductor portion 40 disposed in a connection in the present embodiment connect the drain portion 30 to the source portion 10. When the thin film transistor device 100 is turned on and a voltage difference exists between the drain portion 30 and the source portion 10, a driving current can be transmitted from the source portion 10 to the drain portion 30 through the active layer 20 and the conductor portion 40 in sequence, or can be transmitted from the drain portion 30 to the source portion 10 through the active layer 20 and the conductor portion 40 in sequence. The drain portion 30 and the source portion 10 may be disposed in the same layer or in different layers, as long as insulation between the drain portion and the source portion is ensured and the drain portion 30 and the active layer 20 are connected by the conductor portion 40.

It may be understood that, since the conductor portion 40 can electrically connect the drain portion 30 to the active layer 20, that is, a material forming the conductor portion 40 is a conductor, and a material forming the active layer 20 a semiconductor, a resistance of the conductor portion 40 herein is negligible relative to the active layer 20. That is to say, a main factor hindering the driving current herein is an effective resistance of the active layer 20. It may be understood that, since the active layer 20 is located above the source portion 10, the driving current can be transmitted to the source portion 10 from the source portion 10 along a longitudinal direction of the active layer 20, or transmitted from the longitudinal direction of the active layer 20. That is to say, a transmission length of the driving current may be approximately equal to a thickness of the active layer 20. In other words, a longitudinal resistance of the active layer 20 is the effective resistance of the active layer 20. Since the thickness of the active layer 20 is much smaller than a length of the active layer 20, the transmission length of the driving current is relatively small, and the effective resistance of the active layer 20 is also relatively small. The two manners can both lead to a relatively large driving current of the thin film transistor device 100. In this way, a driving ability of the thin film transistor device 100 is improved.

The thin film transistor device 100 further includes a base plate 50 located on a side of the source portion 10 that is away from the active layer 20. The base plate 50 is configured to at least carry the source portion 10, the active layer 20, the drain portion 30, and the conductor portion 40. In detail, the base plate 50 may be a rigid base plate or a flexible base plate. The rigid base plate may be glass or a silicon wafer. A material forming the rigid base plate may include at least one of quartz powder, strontium carbonate, barium carbonate, boric acid, boric anhydride, aluminum oxide, calcium carbonate, barium nitrate, magnesium oxide, tin oxide, and zinc oxide. The flexible base plate may be a substrate having a polymer material, a metal foil substrate, an ultra-thin glass substrate, a polymer/inorganic substrate, or a polymer/organic/inorganic substrate. The polymer material may include at least one of polyethylene, polypropylene, polystyrene, polyethylene terephthalate, polyethylene naphthalate, and polyimide.

In an embodiment, as shown in FIGS. 1 to 4, the drain portion 30 and the source portion 10 are disposed in the same layer. In detail, the drain portion 30 and the conductor portion 40 may be located on a left side or a right side of the source portion 10. For example, the drain portion 30 and the conductor portion 40 are located on the right side of the source portion 10 herein. It may be understood that, when the drain portion 30 and the source portion are disposed in the same layer and are spaced apart, the drain portion 30 and the source portion 10 may be manufactured using a same manufacturing process and a same material. In this way, efficiency of manufacturing the drain portion 30 and the source portion 10 is improved. It should be noted that a distance between the drain portion 30 and the source portion 10 is required to enable insulation between the drain portion 30 and the source portion 10.

In an embodiment, as shown in FIGS. 1 to 4, a thin film transistor device 100 further includes: a blocking portion 60, covering a side of the source portion 10 that is close to the drain portion 30. It may be understood that, since the blocking portion 60 is located between the source portion 10 and the drain portion 30, the blocking portion 60 can isolate conductive media such as air between the source portion 10 and the drain portion 30, to insulate the source portion from the drain portion 30. The blocking portion 60 may cover a side of the source portion that is close to the drain portion 30 and extend toward the drain portion 30. Further, two sides of the blocking portion 60 may be respectively connected to the source portion 10 that is close to the drain portion 30 to completely isolate conductive media such as air between the source portion 10 and the drain portion 30. Moreover, at this time, upper surfaces of the source portion 10, the blocking portion 60, and the drain portion 30 may form a flat surface. The conductor portion 40 may be formed on the flat surface. In this way, the conductor portion 40 is prevented from falling into a gap, and a conductivity of the conductor portion 40 is enhanced.

Figure 2:
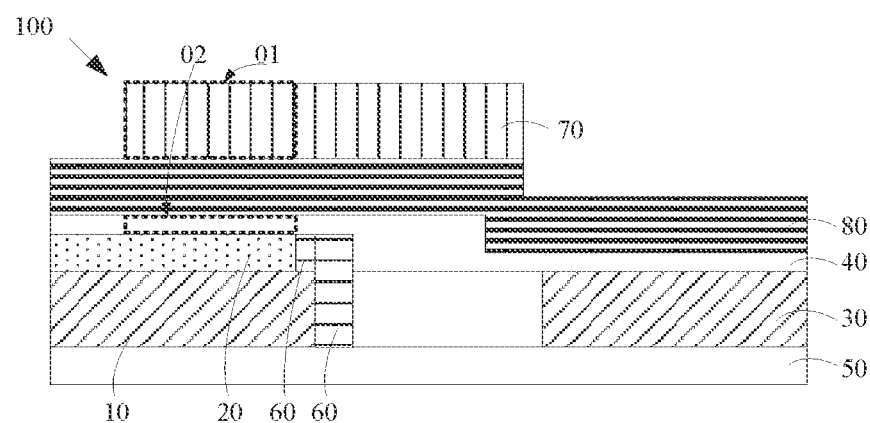
FIG. 2 is a schematic cross-sectional view of another thin film transistor device according to an embodiment of the present disclosure.
Figure 3:
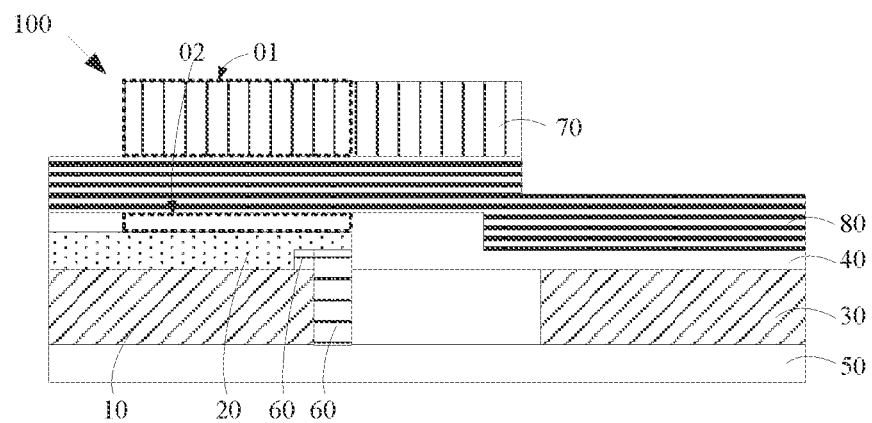
FIG. 3 is a schematic cross-sectional view of still another thin film transistor device according to an embodiment of the present disclosure.
Figure 4:
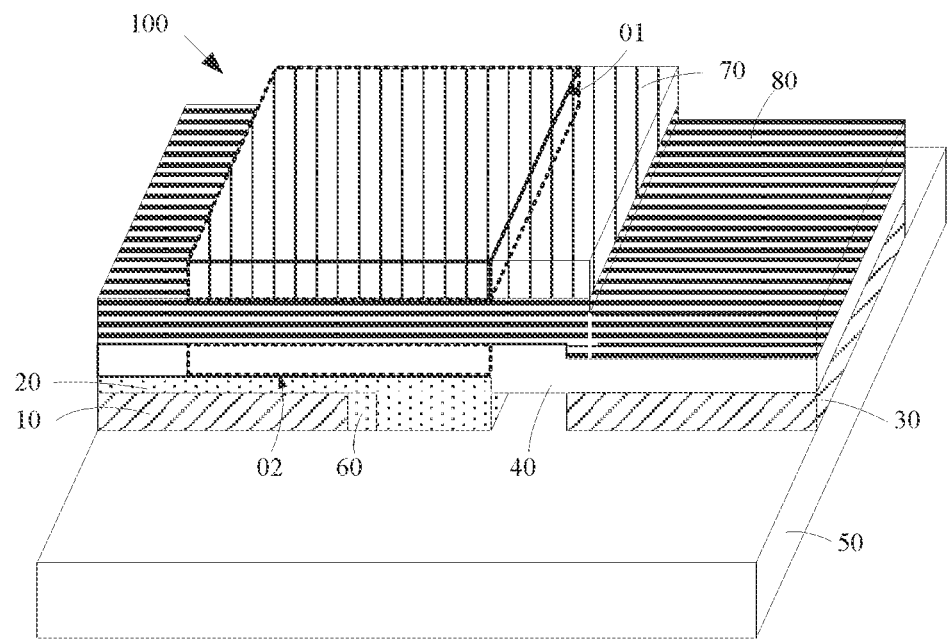
FIG. 4 is a three-dimensional schematic view of a thin film transistor device according to an embodiment of the present disclosure.

In detail, as shown in FIGS. 1 and 4, the blocking portion 60 may be prepared simultaneously with the active layer 20. That is to say, the blocking portion 60 and the active layer 20 may be simultaneously prepared at least on an upper side and a side face of the source portion 10 using a semiconductor material, to improve efficiency of manufacturing the blocking portion 60 and the active layer 20. Certainly, in order to facilitate the preparation of the blocking portion 60 and improve the insulation effect of the blocking portion 60, the semiconductor material may also be formed on the base plate 50, so that the blocking portion 60 extends from the side face of the source portion 10 to the base plate 50. In detail, as shown in FIGS. 2 to 3, the blocking portion 60 may also be prepared alone, that is, the blocking portion 60 and the active layer 20 may be formed successively. A material forming the blocking portion 60 may be an insulating material, to further insulate the source portion 10 from the drain portion 30.

In an embodiment, as shown in FIGS. 2 to 3, the side of the source portion 10 that is close to the drain portion 30 protrudes from the active layer 20, and the blocking portion 60 further covers a part, on the side of the source portion 10 that is close to the drain portion 30, that protrudes from the active layer 20. It should be noted that when the active layer 20 covers a part of the source portion 10 that is close to the drain portion 30, the drain portion 30 and the source portion 10 can be prevented from being contacting each other by virtue of the active layer 20 and the blocking portion 60. However, when the side of the source portion 10 that is close to the drain portion 30 protrudes from the active layer 20, if the blocking portion 60 further covers the portion, on the side of the source portion 10 that is close to the drain portion 30, that protrudes from the active layer 20, a path connecting the drain portion 30 and the source portion can be isolated to insulate the drain portion 30 from the source portion 10. As shown in FIG. 2, a part of the blocking portion 60 that is located on the source portion 10 may have a same height as the active layer 20, that is, the upper surface of the blocking portion 60 may be flush with the upper surface of the active layer 20. Certainly, as shown in FIG. 3, the upper surface of the blocking portion 60 may also be lower than the upper surface of the active layer 20. In this case, the active layer 20 may further extend to cover the blocking portion 60, and a quantity required for bending the blocking portion 60 can be reduced. In this way, damage to the blocking portion 60 can be avoided, and the conductivity of the conductor portion 40 can be enhanced. It should be noted that, herein, the blocking portion 60 is required to cover an area where an edge of the source portion 10 that is close to the conductor portion 40 is located, to ensure that the source portion 10 is insulated from the conductor portion 40.

In an embodiment, as shown in FIGS. 1 to 4, the conductor portion 40 covers the active layer 20 and extends to the blocking portion 60. It may be understood that, since the conductor portion 40 covers the active layer 20, the effective resistance of the active layer 20, a width of a transmission path for the driving current of the thin film transistor device 100, and the driving current of the thin film transistor device 100 can be maximized. It may be understood that the conductor portion 40 may cover the active layer 20 and extend through the blocking portion 60 to come into contact with the drain portion 30, so as to electrically connect the active layer 20 to the drain portion 30. Certainly, the conductor portion 40 may cover or may not cover the drain portion 30.

In an embodiment, as shown in FIGS. 1 to 4, the gate portion 70 is located above or below the active layer 20, and the gate portion 70 includes an effective gate area 01 disposed opposite to the active layer 20. An area 02 of the conductor portion 40 that is disposed opposite to the effective gate area 01 or an area of the source portion 10 that is disposed opposite to the effective gate area 01 includes a hollowed-out area. As shown in FIGS. 1 to 4, herein, the gate portion 70 is located on a side of the active layer 20 that is away from the source portion 10, for example. That is to say, the thin film transistor device 100 may be a top gate structure. Certainly, the gate portion 70 may also be located on the side of the source portion 10 that is away from the active layer 20. That is to say, the thin film transistor device 100 may also be a bottom gate structure. It should be noted that the thin film transistor device 100 further includes an insulating layer 80. The insulating layer 80 covers a side of the active layer 20 that is close to the gate portion 70 and extends to the drain portion 30. The insulating layer 80 is configured to insulate the active layer 20 from the gate portion 70.

A material forming the gate portion 70 may include at least one of conductive materials such as metal, metal oxide, metal nitride, and metal oxynitride. The metal may be, but is not limited to, copper, aluminum, molybdenum, or titanium. In detail, the gate portion 70 may be a single film layer or a composite film layer. When the gate portion 70 is a single film layer, the gate portion 70 may be, but is not limited to, a molybdenum layer, an aluminum layer, a copper layer, or a titanium layer. When the gate portion 70 is a composite film layer, the gate portion 70 may be, but is not limited to, a molybdenum/aluminum/molybdenum layer, an aluminum/molybdenum layer, a molybdenum/copper layer, or a molybdenum titanium alloy/copper layer. A material forming the insulating layer 80 may include at least one of an inorganic dielectric material and an organic dielectric material. The inorganic dielectric material may include at least one of silicon oxide, silicon nitride, and silicon oxynitride. The organic dielectric material may be a polymer material such as polyimide resin, epoxy resin, or acrylic resin. In detail, the insulating layer 80 may be a single film layer or a double film layer. When the insulating layer 80 is a single film layer, the insulating layer 80 may be, but is not limited to, a silicon oxide layer or a silicon nitride layer. When the insulating layer 80 is a double film layer, the insulating layer 80 may be a silicon oxide/silicon nitride layer. The material forming the blocking portion 60 may be the same as the material forming the insulating layer 80.

It should be noted that, when a voltage difference between the gate portion 70 and the active layer 20 falls within a preset range, an electric field is generated between the gate portion 70 and the active layer 20, to achieve turn-on and turn-off and driving performance of the thin film transistor device 100. It should be noted that, if a film layer made of a metal material is located between the gate portion 70 and the active layer 20, especially when the film layer is disposed opposite to the effective gate area 01, the electric field between the gate portion 70 and the active layer 20 is interfered with, thus interfering with the turn-on of the thin film transistor device 100. Therefore, in the present embodiment, when the thin film transistor device 100 is the top gate structure, the area 02 of the conductor portion 40 that is disposed opposite to the effective gate area 01 is designed to include a hollowed-out area, so that an electric field line between the gate portion 70 and the active layer 20 can pass through the hollowed-out area to play a corresponding role. In this way, the interference on the electric field between the gate portion 70 and the active layer 20 is reduced. It may be understood that, when the thin film transistor device 100 is the bottom gate structure, the source portion 10 is located between the active layer 20 and the effective gate region 01. Likewise, the area of the source portion 10 that is disposed opposite to the effective gate area 01 is designed to include a hollowed-out area.

In an embodiment, the hollowed-out area has disposed thereon at least one of a metal grid and a plurality of metal wires intersecting each other. In detail, the metal grid may be manufactured by means of etching or evaporation, and the plurality of metal wires intersecting each other may be manufactured by means of coating. Further, the plurality of metal wires intersecting each other may be a film layer prepared using metal nanowires. The metal nanowires may be, but are not limited to, silver nanowires. As shown in FIGS. 1 to 4, when the gate portion 70 is located on a surface of the conductor portion 40 that is away from the active layer 20, the material forming the conductor portion 40 includes metal nanowires. In detail, the plurality of metal nanowires in the conductor portion 40 may intersect each other and connected to the active layer 20, the blocking portion 60, and the drain portion 30.

The present disclosure further provides a backlight module. The backlight module includes a back panel, a plurality of thin film transistor devices 100, and a plurality of light-emitting devices. The plurality of thin film transistor devices 100 and the plurality of light-emitting devices are located on the back panel. Each thin film transistor device 100 is electrically connected to the corresponding light-emitting device to control a light emission status of the corresponding light-emitting device. The light-emitting device may be, but is not limited to, an LED or a mini LED. One end of the light-emitting device may be electrically connected to the drain portion 30 of the thin film transistor device 100. Another end of the light-emitting device may be loaded with a high voltage signal. A driving current of each thin film transistor device 100 is outputted from the drain portion 30 to the corresponding light-emitting device to control the light emission status of the corresponding light-emitting device. It should be noted that the backlight module is applicable to a liquid crystal display (LCD), that is, the backlight module can provide backlight for the LCD to present a display screen using liquid crystal molecules.

Figure 5:
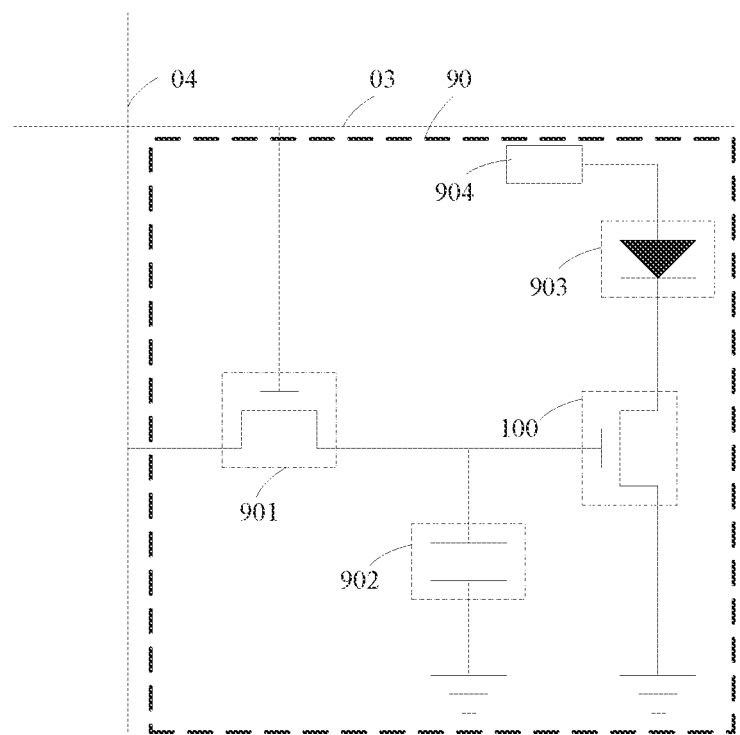
FIG. 5 is a circuit diagram of a light-emitting unit according to an embodiment of the present disclosure.

In detail, the backlight module includes a plurality of scan lines spaced apart from each other and a plurality of data lines spaced apart from each other. As shown in FIG. 5, each scan line 03 intersects with the corresponding data line 04 to define a corresponding light-emitting unit 90. Each light-emitting unit 90 includes a control transistor 901, a capacitor 902, a thin film transistor device 100, and a light-emitting device 903. A gate and a source of the control transistor 901 are respectively connected to the corresponding scan line 03 and the corresponding data line 04. A drain of the control transistor 901 is connected to the capacitor 902 and a gate of the thin film transistor device 100. The control transistor 901 inputs a corresponding control voltage to the capacitor 902 under control of a signal in the corresponding scan line 03 and of a signal in the corresponding data line 04. The capacitor 902 is configured to maintain the control voltage of the gate of the thin film transistor device 100. Further, two ends of the light-emitting device 903 are respectively connected to a high voltage signal source 904 and the drain portion 03 of the thin film transistor device 100. The high voltage signal source 904 provides a high voltage signal to the light-emitting device 100. The driving current of each thin film transistor device 100 is outputted from the drain portion 30 to the corresponding light-emitting device 903 to control the light emission status of the corresponding light-emitting device 903.

The present disclosure further provides a display panel. The display panel includes a liquid crystal cell and any of the backlight modules described above. The liquid crystal cell is disposed on a light exit face of the backlight module. For example, the display panel may be, but is not limited to, an LCD. Alternatively, the display panel may include: a base plate; a thin film transistor layer, located on the base plate and including a plurality of thin film transistor devices described above; and a light-emitting layer, located on the thin film transistor layer and including a plurality of light-emitting portions and a plurality of pixel define portions, wherein each light-emitting portion is electrically connected to the corresponding thin film transistor device, and each pixel define portion is located between two adjacent light-emitting portions. For example, the display panel is, but is not limited to, an organic light-emitting diode (OLED), an LED, or a mini LED. In this case, the plurality of thin film transistor devices in the thin film transistor layer respectively drive the plurality of light-emitting portions to emit light to present a display screen.

The present disclosure provides a thin film transistor device, a backlight module, and a display panel. The thin film transistor device includes a source portion, an active layer, a drain portion, and a conductor portion. The active layer is located on the source portion, the drain portion is spaced apart from the source portion, the conductor portion is located on the active layer and extends to the drain portion, and the drain portion is electrically connected to the active layer using the conductor portion. According to the present disclosure, the active layer is disposed on the source portion, and the drain portion is electrically connected to the active layer using the conductor portion, so that a current can be transmitted from the drain portion to the active layer through the conductor portion Further, the current can be transmitted to the source portion in a thickness direction of the active layer. A transmission path for the current is shortened, a driving current of the thin film transistor device is increased, and a backlight intensity of the backlight module and an illumination intensity of the display panel are improved.

The thin film transistor device, the backlight module, and the display panel provided in the present disclosure are described in detail above. The principles and implementations of the present disclosure are described through specific examples in the present disclosure, and the descriptions of the embodiments are only intended to help understand the methods and core ideas of the present disclosure. It should be understood by a person of ordinary skill in the art that modifications can be made to the technical solutions described in the foregoing embodiments, or equivalent replacements can be made to some technical features in the technical solutions, and such modifications or replacements will not cause the essence of corresponding technical solutions to depart from the scope of the technical solutions in the embodiments of the present disclosure.

What is claimed is:

1. A thin film transistor device, comprising:
a gate portion;
a source portion;
a drain portion, spaced apart from the source portion, wherein the drain portion and the source portion are disposed in a same layer;
an active layer, located on the source portion;
a conductor portion, located on the active layer and extending to the drain portion, and
a blocking portion, covering a side of the source portion that is close to the drain portion, wherein a side of the source portion that is close to the drain portion protrudes from the active layer, and the blocking portion further covers a part, on the side of the source portion that is close to the drain portion, that protrudes from the active layer.

2. The thin film transistor device as claimed in claim 1, wherein the gate portion is located above or below the active layer, and the gate portion comprises an effective gate area disposed opposite to the active layer; and
an area of the conductor portion that is disposed opposite to the effective gate area or an area of the source portion that is disposed opposite to the effective gate area comprises a hollowed-out area.

3. The thin film transistor device as claimed in claim 2, wherein the hollowed-out area has disposed thereon at least one of a metal grid and a plurality of metal wires intersecting each other.

4. The thin film transistor device as claimed in claim 3, wherein the gate portion is located on a surface of the conductor portion that is away from the active layer, and a material forming the conductor portion comprises metal nanowires.

5. The thin film transistor device as claimed in claim 1, wherein the conductor portion covers the active layer and extends to the blocking portion.

6. A backlight module, comprising a back panel, a plurality of thin film transistor devices, and a plurality of light-emitting devices, wherein the plurality of thin film transistor devices and the plurality of light-emitting devices are located on the back panel, and each thin film transistor device is electrically connected to the corresponding light-emitting device; and
the thin film transistor device comprises a gate portion, a source portion, an active layer, a drain portion, a conductor portion, and a blocking portion, the active layer is located on the source portion, the drain portion is spaced apart from the source portion and the active layer, the drain portion and the source portion are disposed in a same layer, the conductor portion is located on the active layer and extends to the drain portion, and a side of the source portion that is close to the drain portion protrudes from the active layer, and the blocking portion further covers a part, on the side of the source portion that is close to the drain portion, that protrudes from the active layer.

7. The backlight module as claimed in claim 6, wherein the gate portion is located above or below the active layer, and the gate portion comprises an effective gate area disposed opposite to the active layer; and an area of the conductor portion that is disposed opposite to the effective gate area or an area of the source portion that is disposed opposite to the effective gate area comprises a hollowed-out area.

8. The backlight module as claimed in claim 7, wherein the hollowed-out area has disposed thereon at least one of a metal grid and a plurality of metal wires intersecting each other.

9. The backlight module as claimed in claim 8, wherein the gate portion is located on a surface of the conductor portion that is away from the active layer, and a material forming the conductor portion comprises metal nanowires.

10. The backlight module as claimed in claim 6, wherein the conductor portion covers the active layer and extends to the blocking portion.

11. A display panel, comprising a liquid crystal cell and a backlight module, wherein the liquid crystal cell is disposed on a light exit face of the backlight module, the backlight module comprises a back panel, a plurality of thin film transistor devices, and a plurality of light-emitting devices, the plurality of thin film transistor devices and the plurality of light-emitting devices are located on the back panel, and each thin film transistor device is electrically connected to the corresponding light-emitting device; and the thin film transistor device comprises a gate portion, a source portion, an active layer, a drain portion, a conductor portion, and a blocking portion, the active layer is located on the source portion, the drain portion is spaced apart from the source portion and the active layer, the drain portion and the source portion are disposed in a same layer, the conductor portion is located on the active layer and extends to the drain portion, and a side of the source portion that is close to the drain portion protrudes from the active layer, and the blocking portion further covers a part, on the side of the source portion that is close to the drain portion, that protrudes from the active layer.

12. The display panel as claimed in claim 11, wherein the drain portion and the source portion are disposed in a same layer.

13. The thin film transistor device as claimed in claim 1, wherein the active layer is spaced apart from the drain portion, and the active layer extends from a top surface of the source portion to a side of the source portion close to the drain portion.

14. The backlight module as claimed in claim 6, wherein the active layer is spaced apart from the drain portion, and the active layer extends from a top surface of the source portion to a side of the source portion close to the drain portion.

15. The display panel as claimed in claim 11, wherein the active layer is spaced apart from the drain portion, and the active layer extends from a top surface of the source portion to a side of the source portion close to the drain portion.

* * * * *